United States Patent
Yokotani et al.

(10) Patent No.: US 8,876,311 B2
(45) Date of Patent: Nov. 4, 2014

(54) LIGHT EMITTING DEVICE AND ILLUMINATION APPARATUS INCLUDING SAME

(75) Inventors: Ryoji Yokotani, Osaka (JP); Keiji Kiba, Niigata (JP)

(73) Assignee: Panasonic Corporation, Osaka (JP)

(*) Notice: Subject to any disclaimer, the term of this patent is extended or adjusted under 35 U.S.C. 154(b) by 228 days.

(21) Appl. No.: 13/457,724

(22) Filed: Apr. 27, 2012

(65) Prior Publication Data

US 2012/0275150 A1     Nov. 1, 2012

(30) Foreign Application Priority Data

Apr. 28, 2011   (JP) ................................. 2011-101170

(51) Int. Cl.
| | | |
|---|---|---|
| *F21V 5/04* | (2006.01) | |
| *F21V 5/00* | (2006.01) | |
| *F21V 3/04* | (2006.01) | |
| *F21V 9/08* | (2006.01) | |
| *F21V 13/02* | (2006.01) | |
| *F21V 13/12* | (2006.01) | |
| *F21Y 103/00* | (2006.01) | |
| *F21Y 101/02* | (2006.01) | |
| *F21Y 103/02* | (2006.01) | |

(52) U.S. Cl.
CPC ............... *F21V 5/007* (2013.01); *F21V 3/0445* (2013.01); *F21V 5/043* (2013.01); *F21V 9/08* (2013.01); *F21V 13/02* (2013.01); *F21V 13/12* (2013.01); *F21V 3/0481* (2013.01); *F21Y 2103/003* (2013.01); *F21Y 2101/02* (2013.01); *F21Y 2103/022* (2013.01); *H01L 2224/48091* (2013.01); *H01L 2224/45147* (2013.01); *H01L 2224/45124* (2013.01); *H01L 2224/45144* (2013.01); *H01L 2924/01047* (2013.01)
USPC .......................... 362/84; 362/235; 362/311.02

(58) Field of Classification Search
USPC .............. 362/311.02, 84, 234–240, 268, 331, 362/800
See application file for complete search history.

(56) References Cited

U.S. PATENT DOCUMENTS

| | | | | |
|---|---|---|---|---|
| 8,052,307 | B2 * | 11/2011 | Bak et al. ...................... | 362/257 |
| 8,147,100 | B2 * | 4/2012 | Yamaguchi .............. | 362/311.02 |

(Continued)

FOREIGN PATENT DOCUMENTS

| | | |
|---|---|---|
| CN | 101510766 | 2/2009 |
| JP | 2002-299697 | 10/2002 |

(Continued)

OTHER PUBLICATIONS

Chinese Office Action dated Jun. 5, 2014 issued in corresponding Chinese application No. 201210129946.9 and the English translation thereof.

*Primary Examiner* — Bao Q Truong
(74) *Attorney, Agent, or Firm* — Bacon & Thomas, PLLC

(57) ABSTRACT

A light emitting device includes a plurality of solid-state light emitting elements; a board on which the solid-state light emitting elements are arranged in the form of an array; and a light distribution adjusting member for adjusting a distribution of lights outputted from the solid-state light emitting elements. The light distribution adjusting member is provided to commonly cover at least two of the solid-state light emitting elements, and includes an accommodating portion which accommodates the solid-state light emitting elements; a concave curved surface portion provided above light output surfaces of the solid-state light emitting elements and immediately above the solid-state light emitting elements; and a pair of convex curved surface portions which are provided in opposite sides of the concave curved surface portion, each of the convex curved surface portions being smoothly connected to the concave curved surface portion.

15 Claims, 18 Drawing Sheets

(56) References Cited

U.S. PATENT DOCUMENTS

| | | |
|---|---|---|
| 2005/0285926 A1 | 12/2005 | Mizuyoshi |
| 2007/0058369 A1* | 3/2007 | Parkyn et al. ................. 362/235 |
| 2009/0207586 A1 | 8/2009 | Arai et al. |
| 2009/0296017 A1 | 12/2009 | Itoh et al. |
| 2010/0061078 A1* | 3/2010 | Kim ............................... 362/84 |
| 2010/0172122 A1* | 7/2010 | Ramer et al. .................... 362/84 |
| 2011/0007513 A1* | 1/2011 | Zhang et al. ............. 362/311.02 |
| 2011/0280020 A1* | 11/2011 | Chen et al. .................... 362/294 |

FOREIGN PATENT DOCUMENTS

| | | |
|---|---|---|
| JP | 2006-49857 | 2/2006 |
| JP | 2006-054396 | 2/2006 |
| JP | 3141606 | 5/2008 |
| JP | 2009-21221 | 1/2009 |
| JP | 2009-192915 | 8/2009 |
| JP | 2010-129447 | 6/2010 |
| JP | 2011-14555 | 1/2011 |
| KR | 10-0986468 | 10/2010 |

* cited by examiner

LIGHT OUTPUT DIRECTION

LIGHT EMITTING DEVICE AND ILLUMINATION APPARATUS INCLUDING SAME

FIELD OF THE INVENTION

The present invention relates to a light emitting device including a plurality of solid-state light emitting elements as a light source, and an illumination apparatus including the light emitting device.

BACKGROUND OF THE INVENTION

Because of their low power consumption, high luminance and high durability, light emitting diodes (LEDs) are in the spotlight as a light source for an illumination apparatus with which incandescent lamps, fluorescent lamps and the like are replaced. However, since a single LED provides less light intensity than a fluorescent lamp, a light emitting device including a plurality of LEDs is used for a general illumination apparatus having LEDs as a light source.

As one example of such a type of light emitting device, as shown in FIG. 19A, there has been known a light emitting device 101 in which a plurality of LEDs 102 is mounted on an elongated board 103 in a line and a semicylindrial transparent resin part 104 is provided to cover the LEDs 102 (see, e.g., Japanese Patent Application Publication No. 2002-299697 (JP2002-299697A).

In addition, as shown in FIG. 20A, there has been proposed an illumination apparatus 110 in which a plurality of LED packages 101 having respective hemispherical transparent resin parts is arranged and a diffusion and transmission panel 107 is disposed adjacent to the front side of the LED packages 101.

However, in the light emitting device 101 disclosed in JP2002-299697A, lights emitted from the LEDs 102 are propagated straight through or refracted in the directly upward direction of the LEDs 102 by the semicylindrical transparent resin part 104 to be collected. On that account, a distribution of emitted lights shows a high directivity in a light output direction, as shown in FIG. 19B. Accordingly, in an illumination apparatus including such a light emitting device, luminance of portions immediately above the LEDs 102 becomes increased, and, even if a light diffusion cover or the like is provided to cover the LEDs 102, a luminance distribution at the light output surface becomes non-uniform, and surface reflection is likely to occur.

In addition, in the above-mentioned illumination apparatus 110, luminance of portions immediately above the LED packages 101 of the diffusion and transmission panel 107 becomes increased. This results in a non-uniform distribution of luminance at the output surface (the diffusion and transmission panel 107) of the illumination apparatus, thereby resulting in a granule-like distribution of the lights, and causing surface reflection, as shown in FIG. 20B.

SUMMARY OF THE INVENTION

In view of the above, the present invention provides a light emitting device which is capable of widening a light distribution of output lights and preventing non-uniform light distribution, and an illumination apparatus including the light emitting device.

In accordance with an aspect of the present invention, there is provided a light emitting device including a plurality of solid-state light emitting elements; a board on which the solid-state light emitting elements are arranged in the form of an array; and a light distribution adjusting member for adjusting a distribution of lights outputted from the solid-state light emitting elements. The light distribution adjusting member is provided to commonly cover at least two of the solid-state light emitting elements, and includes an accommodating portion which accommodates the solid-state light emitting elements; a concave curved surface portion provided above light output surfaces of the solid-state light emitting elements and immediately above the solid-state light emitting elements; and a pair of convex curved surface portions which are provided in opposite sides of the concave curved surface portion, each of the convex curved surface portions being smoothly connected to the concave curved surface portion.

The light emitting device may further include a diffusion and transmission cover member which covers the light distribution adjusting member.

A light output surface of the light distribution adjusting member may be a rough surface.

The light output surface of the solid-state light emitting elements may be covered with a transparent resin member.

An air layer may be interposed between the solid-state light emitting elements and an inner surface of the accommodating portion.

The accommodating portion may have slopes in a cross section that is perpendicular to a longitudinal direction thereof in such a way that angles of the slopes become smaller as the slopes approach closer to a light output axis extending through a central portion of each of the light emitting elements.

A plurality of convex lenses may be provided on a light output surface of the light distribution adjusting member in a longitudinal direction of the light distribution adjusting member.

A plurality of concave lenses may be provided on a light output surface of the light distribution adjusting member in a longitudinal direction of the light distribution adjusting member.

The transparent resin member may contain a fluorescent material to form a wavelength converting member.

The wavelength converting member is formed to have a thickness larger in a vertical direction of the solid-state light emitting elements than that in a lateral direction thereof in a cross section perpendicular to the longitudinal direction of the light distribution adjusting member.

The wavelength converting member may be formed to a vertically long convex shape in the cross section perpendicular to the longitudinal direction of the light distribution adjusting member.

The wavelength converting member may be formed to a vertically long triangular shape in the cross section perpendicular to the longitudinal direction of the light distribution adjusting member.

The wavelength converting member may be formed to a circular shape when viewed from above.

The wavelength converting member may be formed to have an ellipsoidal shape in the longitudinal direction of the light distribution adjusting member when viewed from above.

The wavelength converting member may be formed by coating the transparent resin with a resin containing a fluorescent material or a sheet of a fluorescent material.

The plurality of solid-state light emitting devices may be arranged in a straight line and the light distribution adjusting member may also be formed in a straight line.

The plurality of solid-state light emitting devices may be arranged in a ring shape and the light distribution adjusting member may also be formed in a ring shape.

In accordance with another aspect of the present invention, there is provided an illumination apparatus including the light emitting device.

In accordance with the aspects of the present invention, since most of lights emitted from the solid-state light emitting devices into the accommodating portion of the light distribution adjusting member are totally reflected by the concave curved surface portion to propagate in the lateral direction and some of the lights are refracted by the concave curved surface portion to be transmitted therethrough. In addition, the light emitting device provides low directivity, thereby preventing a non-uniform light distribution when the light emitting device is incorporated in an illumination apparatus.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
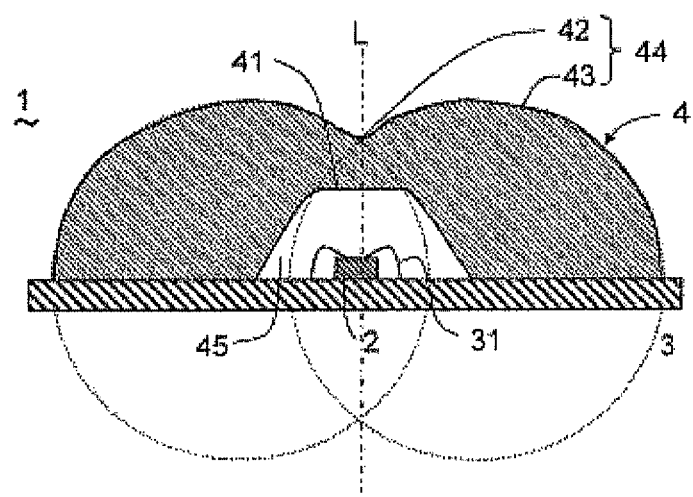
FIG. 1 is a side cross sectional view of a light emitting device in accordance with a first embodiment of the present invention.
Figure 2:
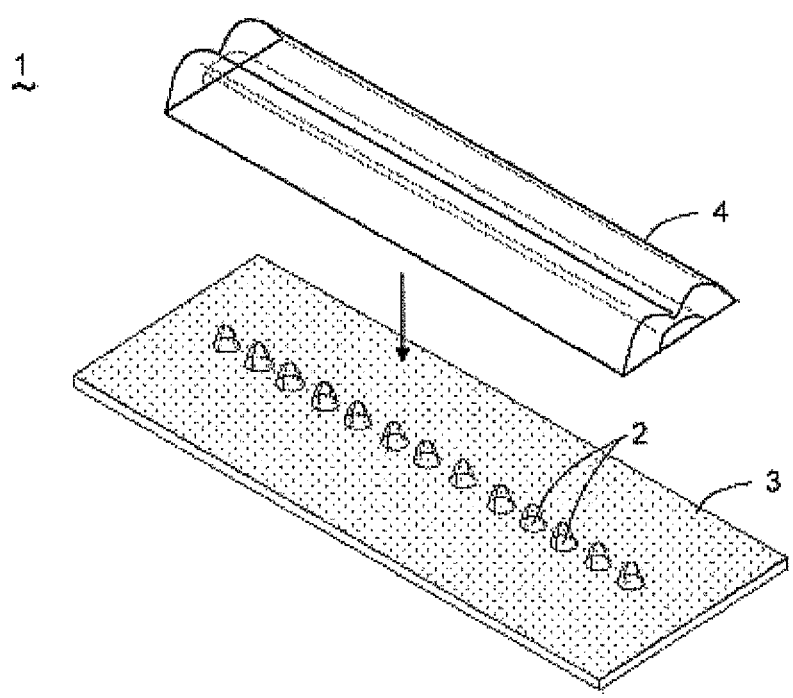
FIG. 2 is an exploded perspective view of the light emitting device.

Hereinafter, a light emitting device and an illumination apparatus including same in accordance with a first embodiment of the present invention will be described with reference to FIGS. 1 to 4C. In this embodiment, as shown in FIGS. 1 and 2, a light emitting device 1 includes a plurality of light emitting diodes (LEDs) 2 as solid-state light emitting elements; a wiring board (hereinafter abbreviated as a "board") 3 on which the LEDs 2 are arranged in the form of an array; and a light distribution adjusting member 4 which adjusts a distribution of lights emitted from the LEDs 2.

The light distribution adjusting member 4 is provided to commonly cover at least two of the LEDs 2. The light distribution adjusting member 4 includes an accommodating portion 41 which accommodates the LEDs 2; a concave curved surface portion 42 provided above light output surfaces of the LEDs and immediately above the LEDs 2; and a pair of convex curved surface portions 43 provided in opposite sides of the concave curved surface portion 42, each of the convex curved surface portions 43 having a smooth surface continuously connected to the concave curved surface portion 42.

Each of the convex curved surface portions 43 has a surface which can be obtained by removing a dotted-line portion (shown in FIG. 1) from a substantially precise circle whose center lies on the board 3. The concave curved surface portion 42 is a surface which is dented in the reverse direction to the direction of the convex curved surface portions 43, smoothly connected to the pair of convex curved surface portions 43, and perpendicular to a light output axis L extending through the central portion of the light output surface of the LEDs.

The LEDs 2 may not be particularly limited as long as they can act as a light source to emit a desired color light for the light emitting device 1. A GaN blue LED chip to emit a blue light having an emission peak wavelength of 460 nm may be properly used. A size of each LED 2 is also not particularly limited but is preferably □0.3 mm. In this embodiment, a so-called face-up type element having both positive and negative electrodes formed on its top surface is used for the LED 2. As a method of mounting the LED 2, the LED 2 is bonded on the board 3 by means of a die bonding material (not shown) and the electrodes formed on the top surface of the LED 2 are connected to wiring patterns (not shown) formed on the board 3 by means of wires 31. Accordingly, the LED 2 is electrically connected to the wiring patterns.

Examples of the die bonding material may include a silicone resin, a silver paste and other high heat-resistant epoxy resins. Although the face-up type element is illustrated here to be mounted by die bonding and wire bonding for the mounting of the LED 2, the LED 2 may be a face-down type element having electrodes formed on its bottom surface, in which case the LED 2 is mounted by, for example, a flip chip mounting method.

For the board 3, a general-purpose board such as a glassy epoxy resin or the like is used as a base material. Alternatively, a ceramic board made of alumina or aluminum nitride or a metal board having an insulating layer formed on its surface may be used for the board 3. The wiring patterns formed on the board 3 are used to supply a power to the LED 2. The board 3 may have a size and a shape as far as the size and the shape are adequate for such members as the LED 2 and the light distribution adjusting member 4 to be mounted thereon, and a thickness as far as the thickness is adequate to provide strength sufficient to prevent deformation, such as bending, of the board 3 when the board 3 is processed. In case of the LED 2 having the size of □0.3 mm, a long rectangular board 3 of 40 mm×200 mm is used although it may depend on the number of LEDs 2.

The wiring patterns are formed on the board 3, for example by subjecting an Au surface to plating treatment. The plating treatment may be carried out on other metal such as Ag, Cu, Ni or the like, instead of Au. In addition, the surface of each wiring pattern is not limited to the single-layered structure of Au but may have a stacked structure of, for example, Au, Ni and Ag in order to improve the adhesiveness to the board 3. The surfaces of the wiring patterns may be subjected to light reflection treatment so that lights emitted from the LED 2 to the board 3 can be reflected by the surfaces of the wiring patterns.

In addition, the entire surface of the board 3 and wiring patterns is preferably covered with a white resist except regions required for the connection of the wires 31 and the mounting of the LED 2. The white resist is formed by, for example, a lift-off method or the like. Thus, the wiring patterns are protected by the white resist, which may result in high stability of the wirings, easy handling in incorporating the light emitting device 1 in the illumination apparatus, and high device manufacturing efficiency.

Examples of the wires 31 may include a general-purpose gold wire, an aluminum wire, a silver wire, a copper wire and so on. The wires 31 are bonded to the electrodes of the LEDs 2 and the wiring patterns by means of any known bonding method such as thermal bonding, ultrasonic bonding or the like.

In the light distribution adjusting member 4, the accommodating portion 41 for accommodating the LEDs 2 is formed of the concave shaped portion immediately above the LEDs 2 in a surface opposing the board 3, and the pair of convex curved surface portions 43 is provided to be symmetrical with respect to the concave curved surface portion 42 facing the accommodating portion 41. When the accommodating portion 41 serves as a light input surface through which lights from the LEDs 2 are incident on the light distribution adjusting member 4, the concave curved surface portion 42 and the convex curved surface portions 43 serve as a light output surface 44 through which light is outputted to the outside of the light distribution adjusting member 4. In addition, an air layer 45 is interposed between the LEDs 2 and the accommodating portion 41 on the board 3. The light distribution adjusting member 4 is made of a transparent material such as an acryl resin, a silicone resin, a glass or the like into the above-mentioned shape.

The accommodating portion 41 has slopes in the cross section which is perpendicular to the longitudinal direction of the light distribution adjusting member 4 in such a way that the angles of the slopes become smaller as the slopes approach closer to the light output axis L extending through the central portion of the LED 2 (see FIG. 1). Thus, lights incident on the vicinity of the light output axis L of the accommodating portion 41 can be refracted more laterally.

Figure 3A:
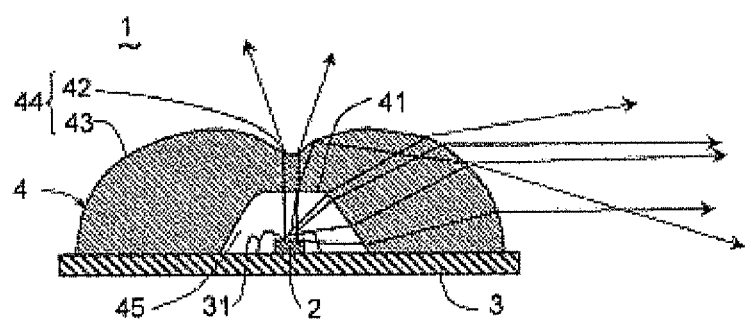
FIGS. 3A and 3B are side cross sectional views showing paths of lights emitted from solid-state light emitting elements in the light emitting device and a light distribution curve of the light emitting device, respectively.
Figure 3B:
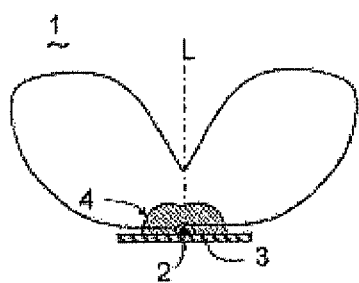

Next, how a light distribution of lights emitted from the LEDs 2 are controlled as the lights are incident on the light distribution adjusting member 4 will be described with reference to FIGS. 3A and 3B. As shown in FIG. 3A, the lights emitted from the LEDs 2 are incident through the accommodating portion 41, propagate through the light distribution adjusting member 4 and are incident onto the concave curved surface portion 42, while some of the lights are refracted and outputted to the outside.

However, since an incidence surface of the concave curved surface portion 42 has a convex shape with respect to the lights incident from the accommodating portion 41, an incidence angle of the lights are increased at a lateral side of the light output axis L of the LED 2. Accordingly, most of the lights incident onto the concave curved surface portion 42 from the accommodating portion 41 are totally reflected toward the lateral side without being refracted and transmitted, and is incident onto the convex curved surface portions 43 located in the lateral direction of the accommodating portion 41. On the other hand, since the incidence surface of the convex curved surface portions 43 has a concave shape with respect to the lights totally reflected by the concave curved surface portion 42, the incident angles of the lights are reduced and the lights are refracted by the concave curved portion 42 to be outputted in the lateral direction.

That is, some of the lights emitted from the LED 2 and incident on the light distribution adjusting member 4 are refracted and transmitted through the accommodating portion 41, but most of the lights are outputted through the convex curved surface portion 43 into the lateral direction. Accordingly, as shown in FIG. 3B, the lights emitted from the light distribution adjusting member 4 has a so-called pad wing type light distribution curve in which an output light flux in the direction of the light output axis L is low while an output light flux in the lateral direction thereof is high. Accordingly, the light emitting device 1 can widen the distribution of lights emitted from the LED 2 and lower the directivity peculiar to the LED as the light source.

In addition, as for the longitudinal direction of the light distribution adjusting member 4, some lights having large incident angles are repeatedly reflected and diffused by a white resist (not shown) provided within the light distribution adjusting member 4 and over the board 3, and are outputted to the outside of the light distribution adjusting member 4 while being guided in the longitudinal direction.

Figure 4A:
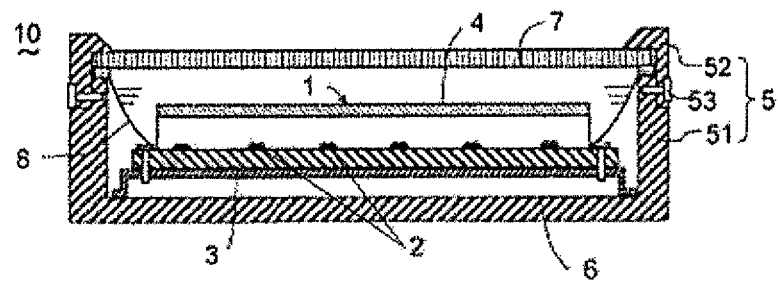
FIGS. 4A to 4C are a longitudinal cross sectional view of an illumination apparatus incorporating the light emitting device, a side cross sectional view thereof, and a plan view thereof, respectively.
Figure 4B:
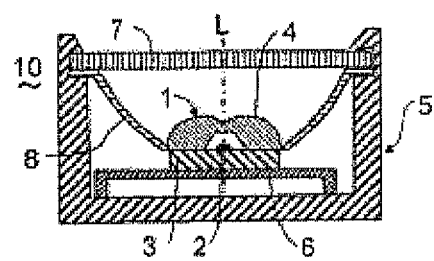
Figure 4C:
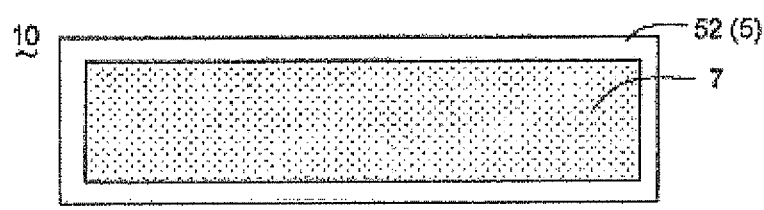

Next, an illumination apparatus 10 incorporating the light emitting device 1 including the plurality of LEDs 2 and light distribution adjusting members 4 will be described with reference to FIGS. 4A to 4C. The illumination apparatus 10 includes a main body 5; an attachment plate 6 for fixing the light emitting device 1 to the main body 5; a light diffusion and transmission panel (hereinafter abbreviated as a "light diffusion panel") 7 disposed in a light output direction of the light emitting device 1; and a reflector 8 for reflecting lights emitted from the light emitting device 1 toward the light diffusion panel 7.

Although, in this embodiment, the illumination apparatus 10 is illustrated as an elongated base light, this illumination apparatus 10 is not particularly limited in its shape. For example, the illumination apparatus 10 may include a square board 3 on which a plurality of rows of LEDs 2 is mounted in the form of an array.

The main body 5 includes an attachment frame 51 having a bottom to which the light emitting device 1 is fixed, and an opening frame 52 attached to an opening of the attachment frame 51 for holding the light diffusion panel 7. The attachment frame 51 is a tubular member having its front side opened and includes a rectangular bottom portion larger than the board 3 and a side portion erected in four sides of the bottom portion in order to receive the light emitting device 1. The side portion of the attachment frame 51 is formed as a female fitting portion having its periphery thinned at the side of the opening.

When a side portion of the opening frame 52 is fitted into the female fitting portion and screws 53 are inserted from the outside, the attachment frame 51 and the opening frame 52 are fixed together. The opening frame 52 is a frame-like member having its center opened to emit lights therethrough; and its periphery projecting inward to hold the light diffusion panel 7. The opening of the opening frame 52 is formed to be larger than the size of the board 3 and widened in the light output direction. The attachment frame 51 and the opening frame 52 are made by pressing a plate such as an aluminum plate or a steel plate having a rigidity into a particular shape. An inner side of the attachment frame 51 may be coated with a white paint or the like.

The attachment plate 6 serves to hold the light emitting device 1 and provides a gap between the board 3 of the light emitting device 1 and the bottom of the attachment frame 51, and is made by pressing a late such as an aluminum plate or a steel plate having a rigidity into the particular shape. The board 3 of the light emitting device 1 and the attachment plate 6 are fixed together by means of through-screws 61. The attachment plate 6 is fixed to the attachment frame 51 by means of screws (not shown), an adhesive or the like. Alternatively, a resin sheet or a stop (not shown) may be inserted between an end of the board 3 and the attachment plate 6 to fix them together.

The attachment plate 6 is preferably made of a material having a high thermal conductivity so that heat from the light emitting device 1 can be efficiently dissipated, and heat dissipating pins may be formed on a surface opposite to the bottom of the attachment frame 51. Accommodated between the board 3 and the bottom of the attachment frame 51 are a power supply, wirings and so on (not shown) for turning on and driving the light emitting device 1.

The light diffusion panel 7 is a rectangular plate-like member made by machining a milky white material into substantially the same shape as the inside dimension of the opening frame 52, the milky white material being obtained by adding diffusion particles such as titanium oxide particles or the like to a transparent resin such as an acryl resin or the like. In addition, the light diffusion panel 7 may be made by a roughening process for performing sand blasting on a front or rear surface of a transparent glass plate or a resin plate, or a texturing process thereon.

The reflector 8 includes a pair of reflective bent plates disposed in opposite sides in a longitudinal direction of the light distribution adjusting member 4 and inclined with respect to the light output axis (FIG. 4B), the light distribution adjusting member 4 covering the LEDs 2 disposed on the board 3 in the form of a matrix. As for the reflector 8, a pair of light diffusing reflectors may be adequately employed, the light diffusing reflector being fabricated by coating a highly reflective white paint on a resin structure having a predetermined shape. The reflector 8 may have a pair of surfaces on each of which silver or aluminum having higher reflectivity is deposited.

In the illumination apparatus 10 configured as above, lights emitted from the light emitting device 1 are incident on the light diffusion panel 7 directly or after being reflected by the reflector 8, and then are outputted into the outside of the illumination apparatus 10. At this time, even if the light diffusion panel 7 is closely disposed adjacent to the light emitting device 1, since the light emitting device 1 emits lights having the pad wing type light distribution through the light distribution adjusting member 4, as shown in FIG. 3B, the directivity of the lights incident on the light diffusion panel 7 becomes decreased. The lights are also diffused and outputted by the light diffusion panel 7. Accordingly, in the illumination apparatus 10, the lights may seem to be emitted from the entire area of the light diffusion panel 7 itself to thereby make the luminance distribution of the light diffusion panel 7 uniform. In addition, since the light diffusion panel 7 can be closely disposed adjacent to the light emitting device 1, the illumination apparatus 10 can be made thinner.

In addition, since the light emitting device 1 can emit lights at a wide angle, when the reflector 8 is provided around the light emitting device 1, more lights become incident on the reflector 8. Accordingly, by adjusting the shape of a reflecting surface of the reflector 8, it is possible to achieve an illumination apparatus 10 with a high controllability of light distribution. In addition, it is possible to suppress the granule-like distribution peculiar to the LED 2 as the light source in an output surface of the light diffusion panel 7 of the illumination apparatus 10 to thereby reduce surface reflection.

Next, the illumination apparatus 10 in accordance with modifications of the present embodiment will be described with reference to FIGS. 5A to 5C.

Figure 5A:
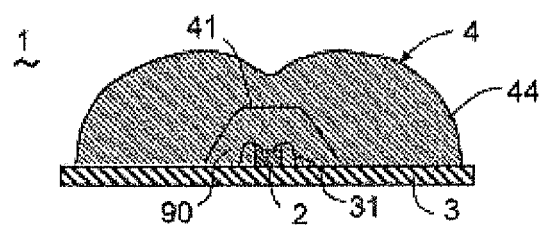
FIGS. 5A to 5C are side cross sectional views showing different modifications of the illumination apparatus.

In accordance with a first modification shown in FIG. 5A, the light output surface of the LED 2 is covered with transparent resin member 90. In this modification, a space surrounded by the accommodating portion 41 of the light distribution adjusting member 4 and the board 3 is filled with a transparent resin. With this configuration, the transparent resin member 90 can protect the LED 2 and the wires 31 through which a current is flowed into the LED 2. Accordingly, the wires 31 are hardly broken, which results in high device reliability.

The transparent resin member 90 is made of the same kind as the resin of which the light distribution adjusting member 4 is made. For example, the transparent resin member 90 may be made of a material having an intermediate refractive index between refractive indexes of the materials of the light distribution adjusting member 4 and the light output surface of the LED 2. This makes it possible to suppress total reflection at interfaces between the light output surface of the LED 2, the transparent resin member 90 and the light distribution adjusting member 4, and efficiently guide the lights, emitted from the LED 2, toward the light distribution adjusting member 4, thereby improving a light use efficiency.

Figure 5B:
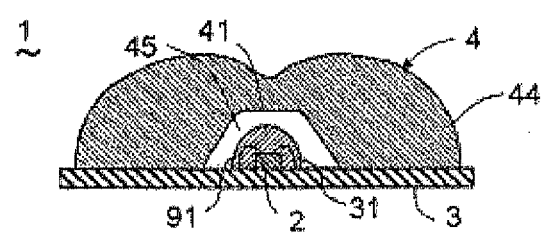

In accordance with a second modification shown in FIG. 5B, the light output surface of the LED 2 is covered with a hemispherical transparent resin member 91. In this modification, an air layer 45 is interposed between the transparent resin member 91 and the accommodating portion 41 of the light distribution adjusting member 4. The hemispherical transparent resin member 91 may be formed by, for example, filling a mold molded into a predetermined shape with a transparent resin, setting upside down the board 3 on which the LED 2 is mounted on the resin filling the mold, and curing the whole structure. Alternatively, the hemispherical transparent resin member 91 may be formed by preparing in advance, by using a transparent resin, a bowl-like mold having a concave portion to serve as a space where the LED 2 is to be disposed, filling the concave portion with the same resin as the mold, loading the mold on the board 3 to cover the LED 2, and curing the whole structure. This configuration can also protect the LED 2 and the wires 31, as in the first modification shown in FIG. 5A.

Figure 5C:
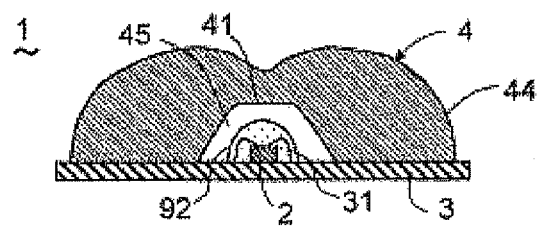

In accordance with a third modification shown in FIG. 5C, the light output surface of the LED 2 is covered with a wavelength converting member 92 obtained by containing a fluorescent material in the resin which the hemispherical transparent resin member 91 shown in FIG. 5B is made of. This configuration can also protect the LED 2 and the wires 31 and serve to convert a wavelength of a light emitted from the LED 2 into a different wavelength of a color light to output the color light.

Figure 6:
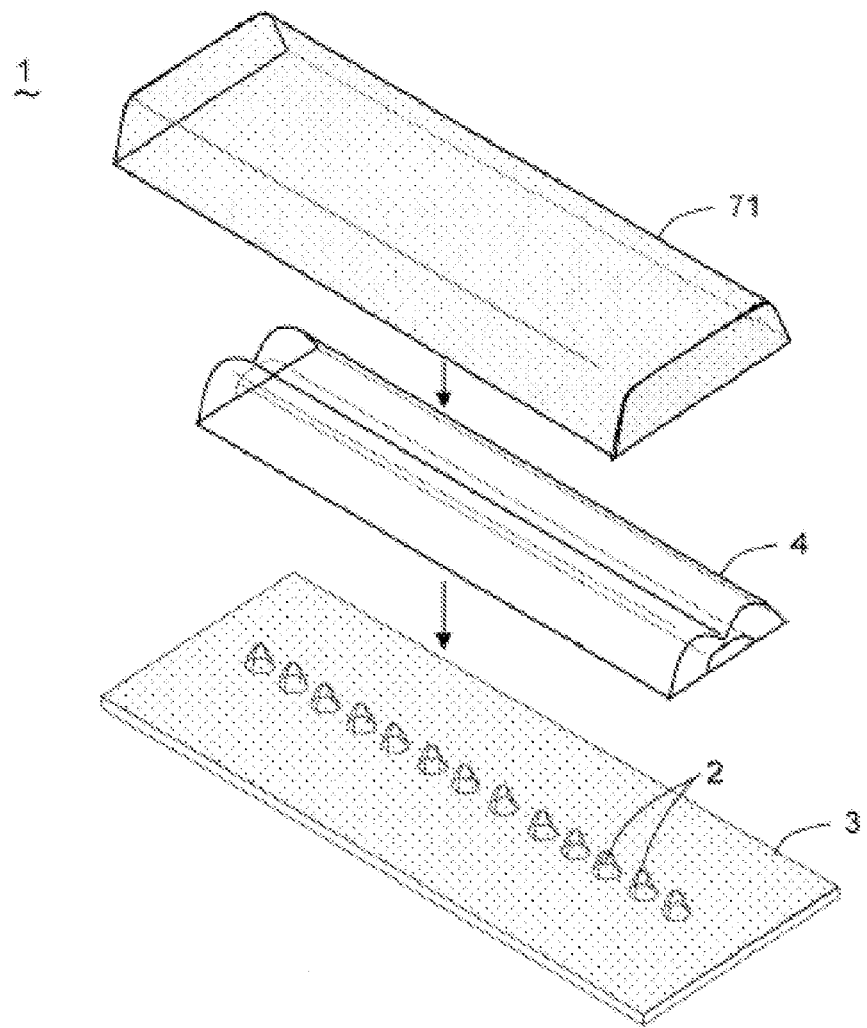
FIG. 6 is an exploded perspective view of a light emitting device in accordance with a second embodiment of the present invention.
Figure 7:
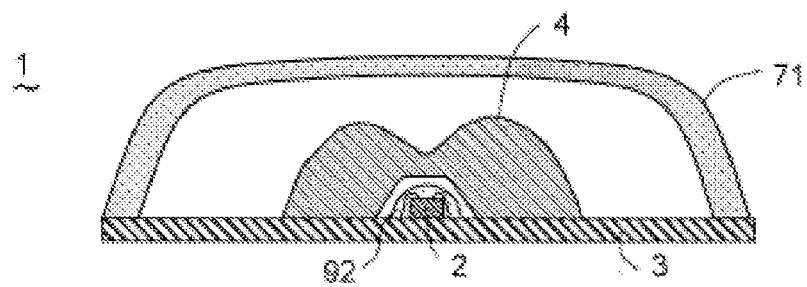
FIG. 7 is a side cross sectional view of the light emitting device.

Next, a light emitting device in accordance with a second embodiment of the present invention will be described with reference to FIGS. 6 and 7. In this embodiment, the light emitting device 1 further includes a diffusion and transmission cover member (hereinafter abbreviated as a "diffusion cover") 71 covering the light distribution adjusting member 4, as shown in FIG. 6. In this embodiment, the light output surface of the LED 2 is also covered with the hemispherical wavelength converting member 92, as shown in FIG. 7.

The diffusion cover 71 is a tubular optical member provided with an accommodating space in which the light distribution adjusting member 4 can be accommodated, the optical member having an open side opposite to the board 3, and is made of a milky white material obtained by adding a white paint to a transparent resin such as an acryl resin or the like. In addition, as shown in FIG. 7, in a cross section of the diffusion cover 71 in the width direction, two opposite side portions thereof are smoothly connected to the upper surface facing the board 3 with respective curved surfaces therebetween. Thus, non-uniform distribution in the side portions can be suppressed.

With this embodiment, since lights can be emitted through the side portions of the diffusion cover 71, it is possible to provide a wider range of illumination. In addition, the illumination apparatus 10 can be built merely by arranging a power supply and the other units without using the main body 5 and the light diffusion panel 7 used in the illumination apparatus 1 of the first embodiment. Accordingly, assembly of the illumination apparatus 10 can be simplified, which results in high manufacture efficiency. In addition, since there is no need of the main body 5, the illumination apparatus 10 can be thinned.

Figure 8A:
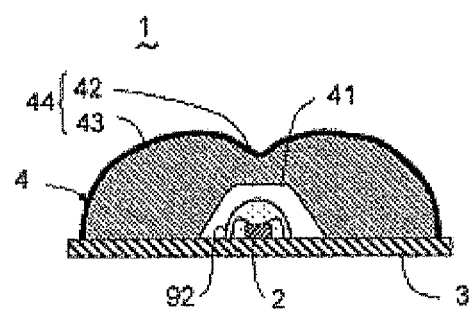
FIGS. 8A and 8B are a side cross sectional view of a light emitting device in accordance with a third embodiment of the present invention and a side cross sectional view showing paths of lights emitted from solid-state light emitting elements of the light emitting device, respectively.
Figure 8B:
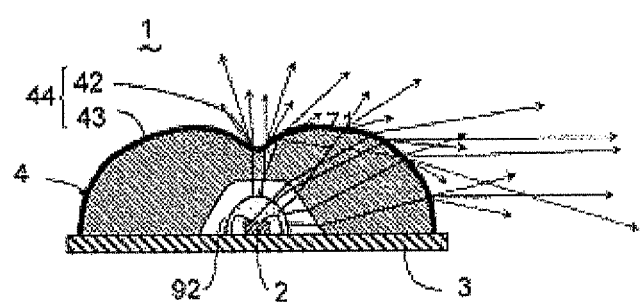

Next, a light emitting device and an illumination apparatus including same in accordance with a third embodiment of the present invention will be described with reference to FIGS. 8A and 8B. In this embodiment, as shown in FIG. 8A, a light emitting device 1 is configured such that the light output surface 44 of the light distribution adjusting member 4 is a rough surface. In FIGS. 8A and 8B, the rough surface is indicated by a thick line. A roughening process of the light output surface 44 is performed with a roughness of, e.g., #100 by sand blast. In the roughness, an area ratio of fine concave portions (not shown) to smooth portions (not shown) is, for example, 1:1 without being limited thereto but may be properly adjusted by controlling a distribution of lights emitted from the light distribution adjusting member 4. This is true of a grain diameter of the sand blast.

However, if the light output surface 44 is a smooth surface, lights (direct lights) refracted and propagated through the light output surface 44 without being totally reflected by the light output surface 44 and lights (totally reflected lights) outputted from the light output surface after being totally reflected by the light output surface 44 more than once are likely to have fluctuating densities in the light distribution. Accordingly, in the illumination apparatus 10 incorporating the light emitting device 1 (see FIG. 4A), a non-uniformity in the luminance may be resulted in the light diffusion panel 7. In contrast, if the light output surface 44 is a rough surface, such density fluctuation can be reduced, thereby suppressing the non-uniformity in the luminance in the light diffusion panel 7, which may result in a more uniform distribution of luminance of the light diffusion panel 7.

Figure 9:
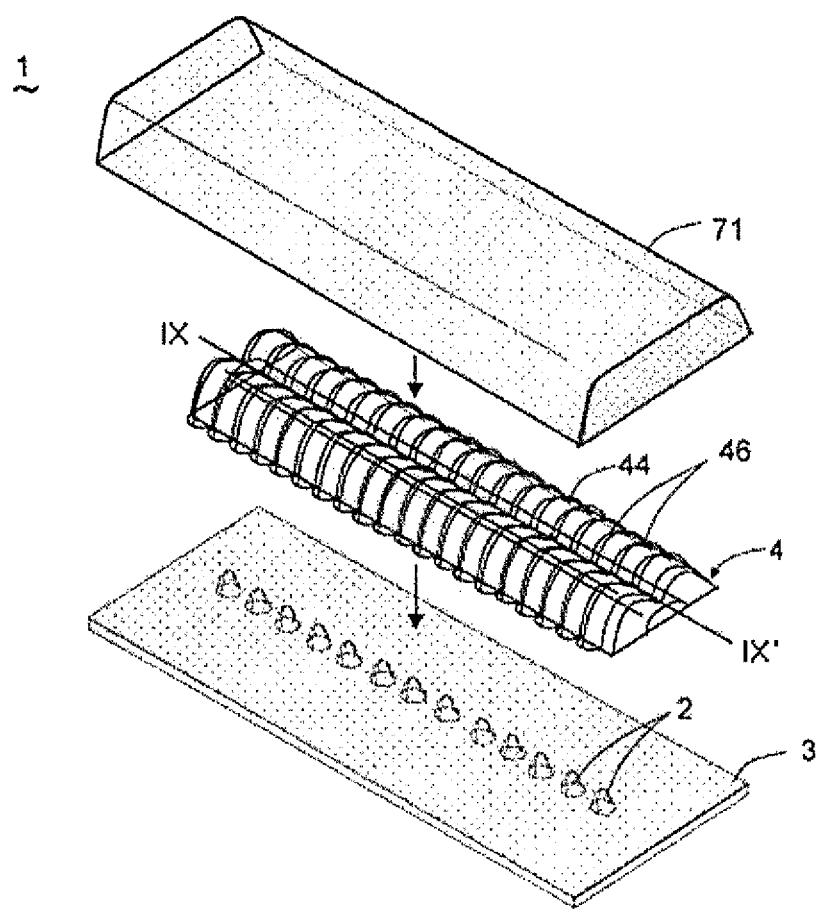
FIG. 9 is an exploded perspective view of a light emitting device in accordance with a fourth embodiment of the present invention.
Figure 10A:
FIGS. 10A to 10C are a sectional view taken along a line IX-IX' in FIG. 9, a plan view of the light emitting device, and a plan view showing a light distribution in the light emitting device, respectively.
Figure 10B:
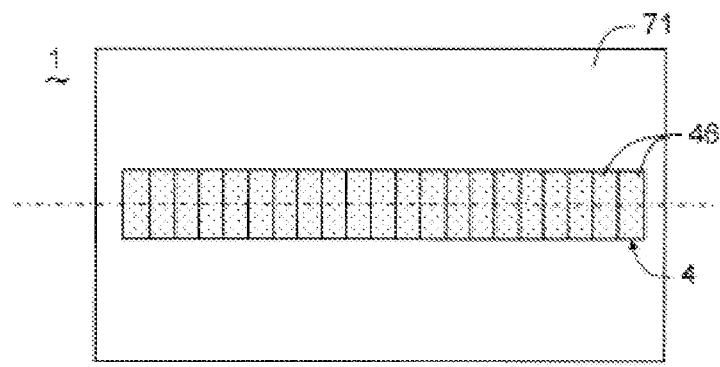

Next, a light emitting device in accordance with a fourth embodiment of the present invention will be described with reference to FIGS. 9 to 10C. In a light emitting device 1 of this embodiment, as shown in FIG. 9, a plurality of convex lenses 46 is provided on the light output surface 44 of the light distribution adjusting member 4 in the longitudinal direction. FIG. 10A is a sectional view taken along line IX-IX' in FIG. 9. In the present embodiment, the diffusion cover 71 is also provided, as in the second embodiment. As shown in FIG. 10B, the diffusion cover 71 is configured such that its length is substantially the same as that of the light distribution adjusting member 4 and its width is larger than that of the light distribution adjusting member 4.

Figure 10C:
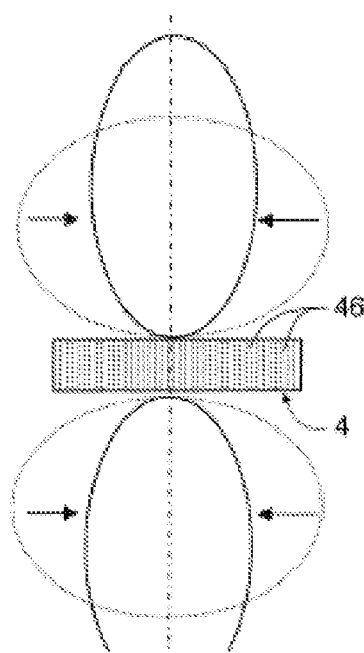

FIG. 10C shows a light distribution of the lights emitted from this light emitting device 1. In the same figure, a solid line denotes a light distribution obtained by using the light distribution adjusting member 4 with the plurality of convex lenses 46 and a dotted line denotes a light distribution obtained by using the light distribution adjusting member 4 without the plurality of convex lenses 46. That is, in accordance with this embodiment, by providing the plurality of convex lenses 46 on the light output surface 44 of the light distribution adjusting member 4, the light distribution is narrowed by the convex lenses 46 when viewed from above, as shown in the same figure.

Accordingly, more lights can be outputted in the width direction of the light distribution adjusting member 4, and, even when the diffusion cover 71 is disposed in the width direction, a luminance distribution in a light output surface of the diffusion cover 71 in the width direction can become uniform. In addition, since the diffusion cover 71 can be disposed more closely, an illumination apparatus 10 including the light emitting device 1 can be made thinner.

Figure 11A:
FIGS. 11A to 11C are a longitudinal cross sectional view of a light distribution adjusting member used for a light emitting device in accordance with a fifth embodiment of the present invention, a plan view thereof, and a plan view showing a light distribution of the lights emitted the light emitting device, respectively.
Figure 11B:
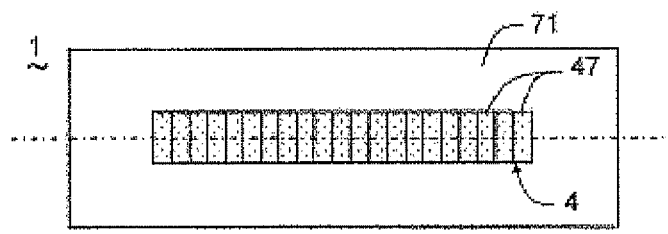

Next, a light emitting device and an illumination apparatus including same in accordance with a fifth embodiment of the present invention will be described with reference to FIGS. 11A to 11C. In a light emitting device 1 of this embodiment, as shown in FIG. 11A, a plurality of concave lenses 47 is provided on the light output surface of the light distribution adjusting member 4 in the longitudinal direction. In the present embodiment, the diffusion cover 71 is also provided, as in the second and fourth embodiments. However, as shown in FIG. 11B, the diffusion cover 71 is configured such that its length and width are slightly larger than those of the light distribution adjusting member 4. Other configurations are the same as those of the fourth embodiment.

Figure 11C:
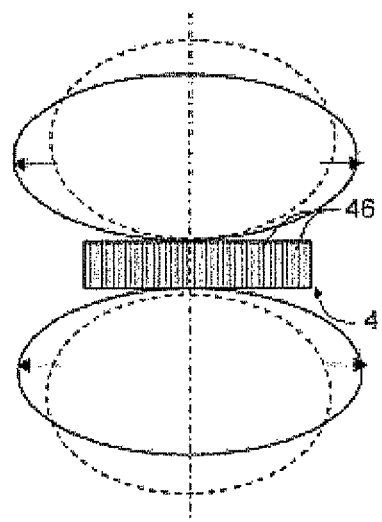

As shown in FIG. 11C, a light distribution (denoted by a solid line) obtained by using the light distribution adjusting member 4 with the plurality of concave lenses 47 is widened in the longitudinal direction of the light distribution adjusting member 4 to be extended further in comparison to a light distribution (denoted by a dotted line) obtained by using the light distribution adjusting member 4 without the plurality of concave lenses 47. That is, in accordance with this embodiment, lights emitted from adjacent LEDs 2 disposed in the form of an array can be effectively mixed, thereby allowing a luminance distribution in the longitudinal direction in a light output surface of the diffusion cover 71 to be uniform.

Figure 12:
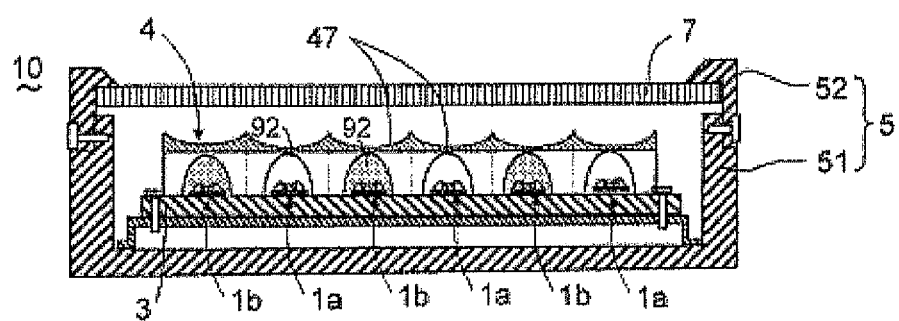
FIG. 12 is a longitudinal sectional view of an illumination apparatus incorporating a modification of the light emitting device.

Next, an illumination apparatus 10 including light emitting devices in accordance with a modification of this embodiment will be described with reference to FIG. 12. In accordance with this modification, each light emitting device 1 (1a and 1b) includes a light distribution adjusting member 4 provided with a concave lens 47 to emit a different color light. The light colors of output lights from the light emitting devices 1 are set to any chromaticity by adjusting the kind of a chip used for a corresponding LEDs 2, the kind and/or the amount of the fluorescent material used for the corresponding wavelength converting member 92, the kind and/or the amount of pigment or paint added to each the wavelength converting member 92, and the like. The colors of irradiating lights of an illumination apparatus 10 may be selected depending on surrounding environments of the illumination apparatus 10. For example, if the illumination apparatus 10 is a general illumination apparatus for living room, it may include a combination of light emitting devices 1a for emitting white lights and light emitting devices 1b for emitting bulb color lights, as shown in the figure.

In conventional LED illumination apparatuses, lights having such different colors may be mixed to a certain degree by the light diffusion panel 7. However, when the light emitting devices 1 and the light diffusion panel 7 are closely arranged adjacent to each other, the mixing may not be sufficiently realized and there may occur non-uniform color distribution in the output surface of the light diffusion panel 7. In contrast, in accordance with this modification, the use of the light distribution adjusting members 4 each including the concave lens 47 facilitates the mixing of lights outputted from the light emitting devices 1a and 1b.

Accordingly, a mixture of the white lights and the bulb color lights is uniformly emitted from the output surface of the light diffusion panel 7, thereby preventing the non-uniform color distribution of the illumination apparatus 10. The light colors of the light emitting devices 1 are not limited to the above white light and bulb color light. For example, a plurality of light emitting devices for emitting red (R), green (G) and blue (B) lights may be used.

Figure 13A:
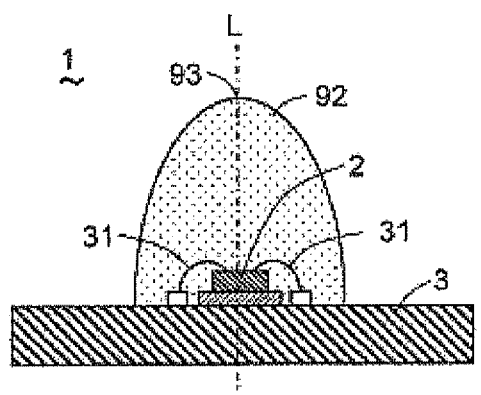
FIGS. 13A to 13C are a side cross sectional view of a light emitting device in accordance with a sixth embodiment of the present invention, a side cross sectional view showing a light distribution of the light emitting device, and a plane view thereof, respectively.

Next, a light emitting device in accordance with a sixth embodiment of the present invention will be described with reference to FIGS. 13A to 13C. A light emitting device 1 of this embodiment includes a wavelength converting member 92 which converts a wavelength of a light emitted from the LED 2 into a different wavelength. The wavelength converting member 92 is configured such that its thickness in vertical direction of the LED 2 is larger than that in a lateral direction thereof when viewed in a cross section perpendicular to the longitudinal direction of the light distribution adjusting member 4.

In this embodiment, the wavelength converting member 92 is formed to have a vertically long convex shape and a semi-ellipsoidal shape having a major axis in the height direction in the cross section such that the wavelength converting member 92 has the thickness larger in the vertical direction of the LED 2 than that in the lateral direction of the LED 2 in the cross section and includes a zenith 93 in the light output direction of the LED 2. In this embodiment, a length ratio of major axis to minor axis of the wavelength converting member 92 is, for example, 2:1 without being limited thereto.

The wavelength converting member 92 is an optical member fabricated by machining a mixed material into the above-mentioned shape, the mixed material being obtained by dispersing a granular yellow fluorescent material, which is excited by the blue light emitted from the LED 2, thereby emitting the yellow light, in a transparent resin (for example, a silicone resin). An example of the transparent resin may include a silicone resin having a refractive index in a range from 1.2 to 1.5.

An example of the fluorescent material may include a known yellow fluorescent material which absorbs some of the blue lights emitted from the LED 2 and is excited by the absorbed blue lights and has a peak wavelength in a wavelength range from 500 to 650 nm. The yellow fluorescent material has an emission peak wavelength within a yellow wavelength range and its emission wavelength range includes a red wavelength range.

The yellow fluorescent material is made of crystals of a Garnet structure of composite oxide of yttrium and aluminum. An example of the yellow fluorescent material may include, but is not limited to, a so-called YAG fluorescent material. For example, a mixture of a plurality of color fluorescent materials may be used to adjust color temperature and color rendition. Particularly, a mixture of red fluorescent material and green fluorescent material may be used to obtain white light having high color rendition. In addition to the above-mentioned fluorescent material, a light diffusing material, a filler and/or the like may be added to the resin material of the wavelength converting member 92. The wavelength converting member 92 is formed in the same method as used for the transparent resin member 91 shown in FIG. 5B.

Lights emitted from the LED 2 are radially radiated mainly along the light output axis L. And some of the lights impinge on the fluorescent material contained in the wavelength converting member 92 such that the fluorescent material transitions from a ground state into an excitation state. The excited fluorescent material returns to the ground state when it emits lights having wavelengths different from the wavelengths of the lights emitted from the LED 2. Accordingly, the fluorescent material can emit lights having the wavelengths to which the wavelengths of the lights from the LED 2 are converted.

The lights having the wavelengths resulting from the wavelength conversion caused by the fluorescent material are radiated from the fluorescent material radially instated of being limited to radiate merely along the light output axis L. That is, by the fluorescent material, the lights emitted from the LED 2 are wavelength-converted and are also radially diffused without being limited to propagate along the output axis L direction of the lights emitted from the LED 2. In addition, the wavelength-converted lights may be diffused in surfaces on other fluorescent materials.

In this embodiment, since the wavelength converting member 92 has the thickness larger in the vertical direction of the LED 2 than that in the lateral direction of the LED 2 in the cross section, lights propagating along the light output axis L of the lights emitted from the LED 2 passes along the longest distance in the wavelength converting member 92. Accordingly, the lights propagating along the light output axis L has just a long distance (optical path) passing through the wavelength converting member 92, and therefore has a high probability for contacting with the fluorescent material, which may obstruct the propagation of the lights along the light output axis L. That is, when the wavelength converting member 92 has the thickness larger in the vertical direction of the LED 2 than that in the lateral direction of the LED 2 in the cross section, the amount of the lights propagating along the light output axis L is decreased as much.

In addition, the lights having the wavelengths resulting from the wavelength conversion caused by the fluorescent material are outputted, with a distribution of diffused lights (for example, BZ5 in the BZ classification), through the output surface of the wavelength converting member 92. Accordingly, a higher area ratio of the side to the top may provide a wider distribution of lights in the side.

Figure 13B:
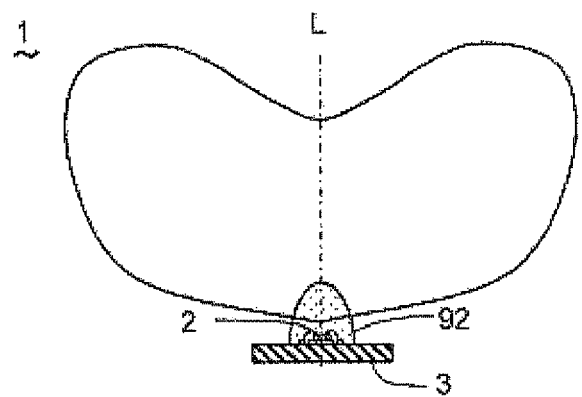

That is, as shown in FIG. 13B, the lights emitted from the wavelength converting member 92 has a so-called pad wing type light distribution curve in which an output light flux in the direction of the light output axis L is low and an output light flux in the lateral direction thereof is high. Accordingly, the lights emitting device 1 can widen the distribution of lights emitted from the LED 2 and lower the directivity peculiar to an LED light source.

In addition, in an illumination apparatus 10 incorporating the light emitting device 1, by using the wavelength converting member 92, it is possible to allow more lights to be emitted in the lateral direction with regard to the longitudinal direction of the light distribution adjusting member 4 and provide a wider distribution of lights.

Figure 13C:
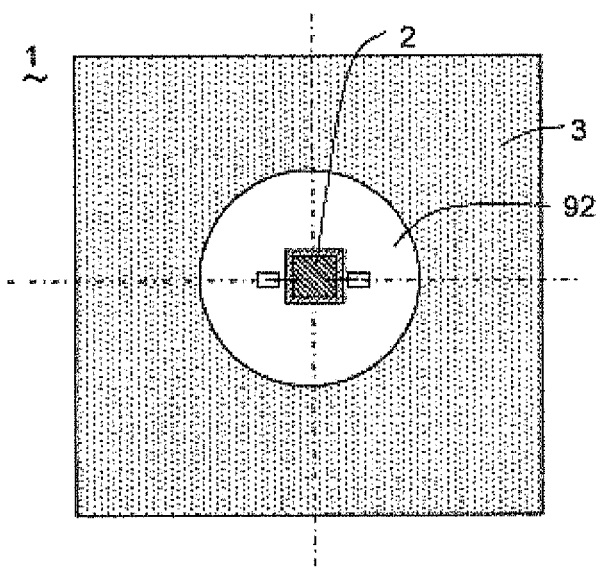

In addition, since the wavelength converting member 92 has a circular shape when viewed from above, as shown in FIG. 13C, lights are isotropically outputted in the lateral direction of the LED 2. Accordingly, when a plurality of light emitting devices 1 is arranged in the form of an array, lights may be irradiated to the light diffusion panel 7 uniformly, thereby making the luminance distribution of the light diffusion panel 7 uniform.

Figure 14A:
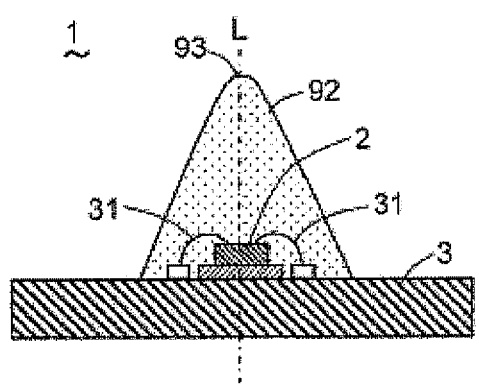
FIGS. 14A and 14B are a side cross sectional view of a modification of the light emitting device and a side cross sectional view showing a light distribution curve of the light emitting device, respectively.
Figure 14B:
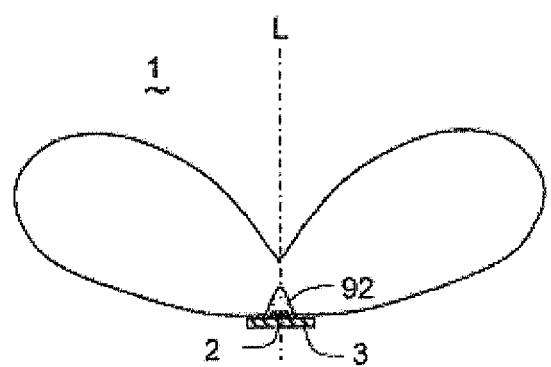

Next, the light emitting device 1 in accordance with modifications of this embodiment will be described with reference to FIGS. 14A, 14B and 15. In accordance with a first modification shown in FIG. 14A, the wavelength converting member 92 is formed to have a vertically long triangular shape in the cross section. A zenith 93 of the wavelength converting member 92 is formed to have a rounded shape instead of a spike shape. Other configurations are the same as those of the above-described embodiment.

In the wavelength converting member 92, lights propagating in the direction of the light output axis L of the lights emitted from the LED 2 are outputted through a long distance in the wavelength converting member 92 and, therefore, a fluorescent material included in the wavelength converting member 92 may interfere with the lights propagating in the direction of the light output axis L. In addition, lights having wavelengths resulting from wavelength conversion caused by the fluorescent material are outputted, with a distribution of diffused lights (BZ5), through the output surface of the wavelength converting member 4. As a result, an area ratio of the side to the top is further increased as compared to the first embodiment, which results in a more remarkable pad wing light distribution, as shown in FIG. 14B.

With this configuration, in the illumination apparatus 10 including the light emitting device 1 (see FIG. 4B), a distance between the light diffusion panel 7 and the light emitting device 1 can be made smaller and the illumination apparatus 10 can be made thinner, thereby improving the controllability of light distribution by the reflector 8.

Figure 15:
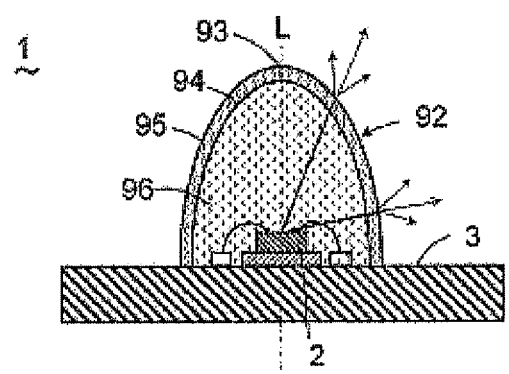
FIG. 15 is a side cross sectional view of another modification of the light emitting device.

In accordance with a second modification shown in FIG. 15, the wavelength converting member 92 has a concave portion 94 formed in the side facing the LED 2. The wavelength converting member 92 is formed as a thin member 95 having uniform thickness, the concave portion 94 being filled with a transparent resin 96. The thin member 95 is formed by coating the transparent resin 96 formed to cover the LED 2 with a resin containing a fluorescent material or a sheet of a fluorescent material. Thickness of the wavelength converting member 92 (thin member 95) ranges from 0.1 to 0.5 mm, for example. The transparent resin 96 is the same resin as the thin member 95 except that it contains no fluorescent material. For example, the transparent resin 96 may be a silicone resin.

As described above, if the wavelength converting member 92 has a semi-ellipsoidal shape having a major axis in the height direction, non-uniform color distribution may occur since there occurs a difference between path lengths of lights emitted from the LED 2 in the wavelength converting member 92. In contrast, when the thickness of the wavelength converting member 92 is made thin and uniform, the difference between path lengths of lights in the wavelength converting member 92 (thin member 95) becomes uniform irrespective of the shape of the wavelength converting member 92, thereby preventing the non-uniform color distribution.

Figure 16A:
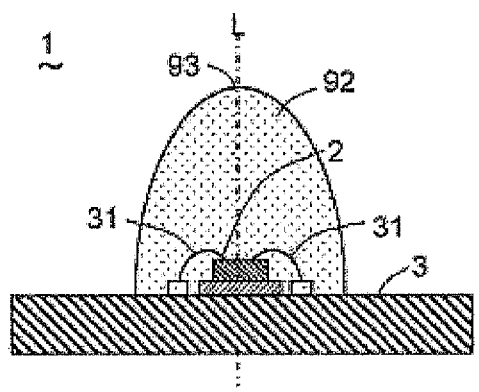
FIGS. 16A and 16B are a side cross sectional view of a light emitting device in accordance with a seventh embodiment of the present invention and a plan view thereof, respectively.
Figure 16B:
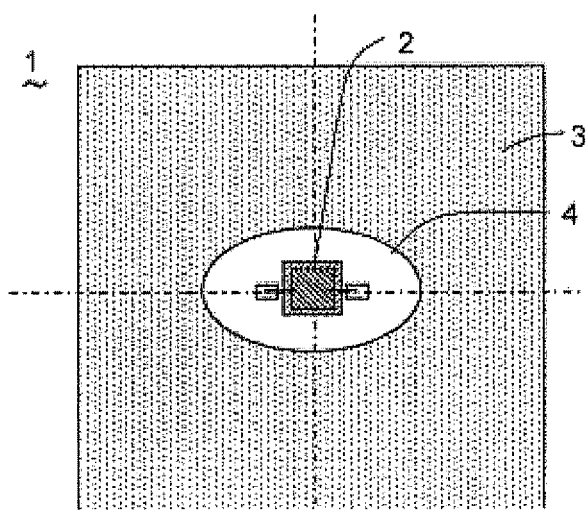
Figure 17A:
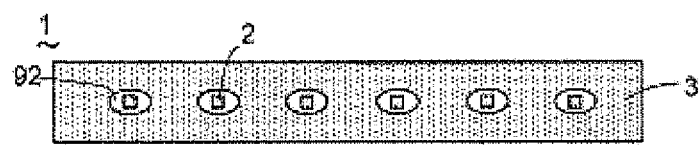
FIGS. 17A to 17D are a plan view showing a structure including a plurality of solid-state light emitting elements and wavelength converting members in the light emitting device, a longitudinal cross sectional view of an illumination apparatus incorporating the light emitting device, a side cross sectional view thereof, and a plan view thereof, respectively.
Figure 17B:
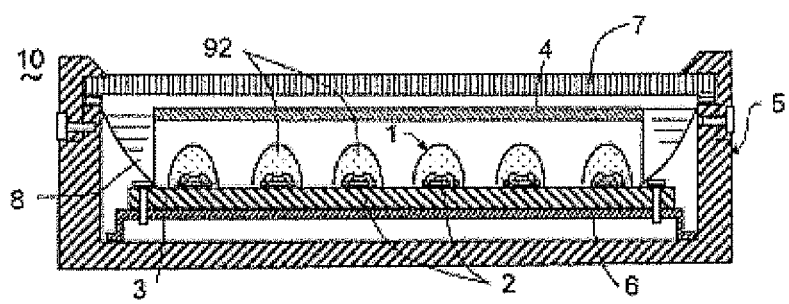
Figure 17C:
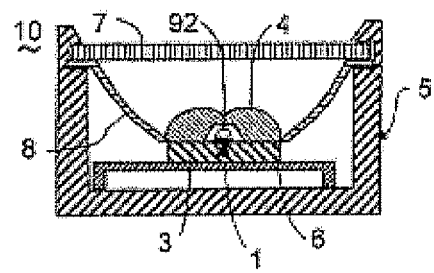
Figure 17D:
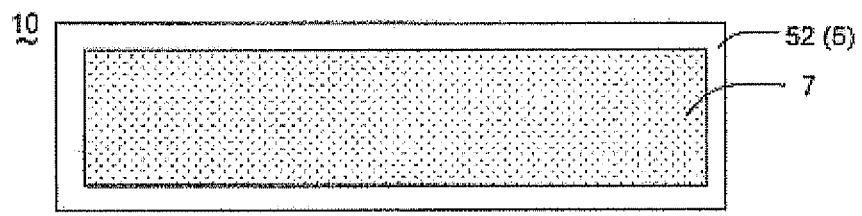

Next, a light emitting device and an illumination apparatus including same in accordance with a seventh embodiment of the present invention will be described with reference to FIGS. 16A to 17D. A light emitting device 1 of this embodiment includes a wavelength converting member 92 formed to have an ellipsoidal shape when viewed from above, as shown in FIG. 16B, although the wavelength converting member 92 has the same cross section as the sixth embodiment, as shown in FIG. 16A.

In the wavelength converting member 92 having the ellipsoidal shape when viewed from above, a side area of the wavelength converting member 92 when viewed from the minor axis direction is larger than a side area thereof when viewed from the major axis direction, which results in an increase in an output light flux in the minor axis direction over that in the major axis direction.

As shown in FIGS. 17A to 17D, in the illumination apparatus 10 incorporating a plurality of light emitting devices 1 including a plurality of LEDs 2 and wavelength converting members 92, the light emitting devices 1 are arranged on a long board 3 in the form of an array in a longitudinal diameter direction of the wavelength converting members 92. Other configurations of the illumination apparatus 10 are the same as those of the first embodiment (see FIGS. 4A to 4D).

In this embodiment, when a plurality of light emitting devices is arranged on the long board 3 in a row with an equal pitch, an amount of lights produced in a direction along a short side of the board 3 can be increased. If an interval between rows of the plurality of light emitting devices 1 arranged in the form of an array is wide, even when the light diffusion panel 7 is closely disposed adjacent to the light emitting devices 1, it is possible to make a luminance distribution at the output surface of the light diffusion panel 7 uniform without producing non-uniform light distribution for each row.

Figure 18A:
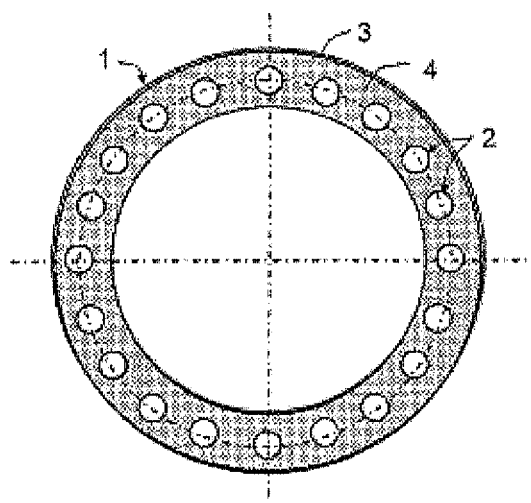
FIGS. 18A to 18C are a plan view showing a structure including a plurality of solid-state light emitting elements and wavelength converting members in a light emitting device in accordance with an eighth embodiment of the present invention, a plan view of an illumination apparatus incorporating the light emitting device, and a partial sectional view of the illumination apparatus, respectively.

Next, a light emitting device and an illumination apparatus including same in accordance with an eighth embodiment of the present invention will be described with reference to FIGS. 18A to 18C. As shown in FIG. 18A, a light emitting device 1 of this embodiment is configured such that a plurality of LEDs 2 is arranged on a ring-like board 3 and light distribution adjusting members 4 are correspondingly formed into a ring shape.

Figure 18B:
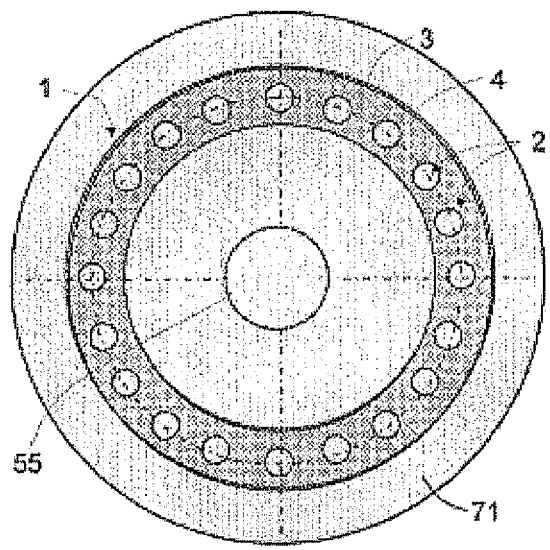
Figure 18C:
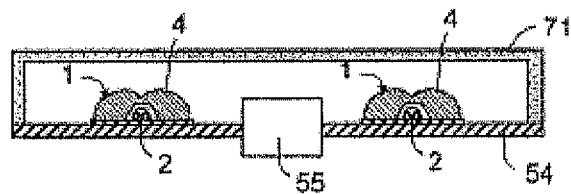
Figure 19A:
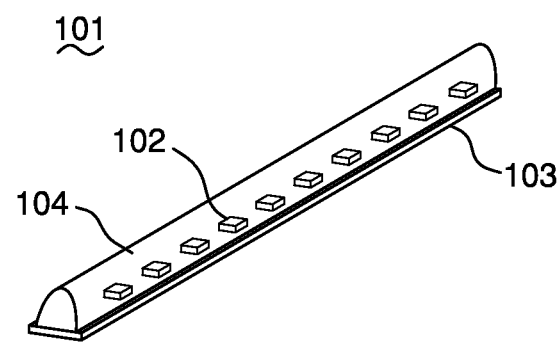
FIGS. 19A and 19B are a side cross view of a conventional light emitting device and a light distribution curve thereof, respectively.
Figure 19B:
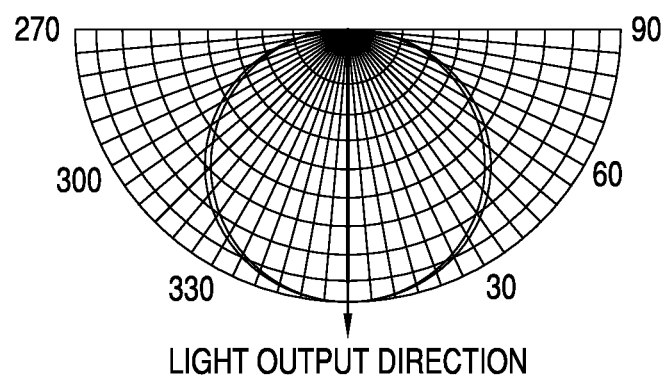
Figure 20A:
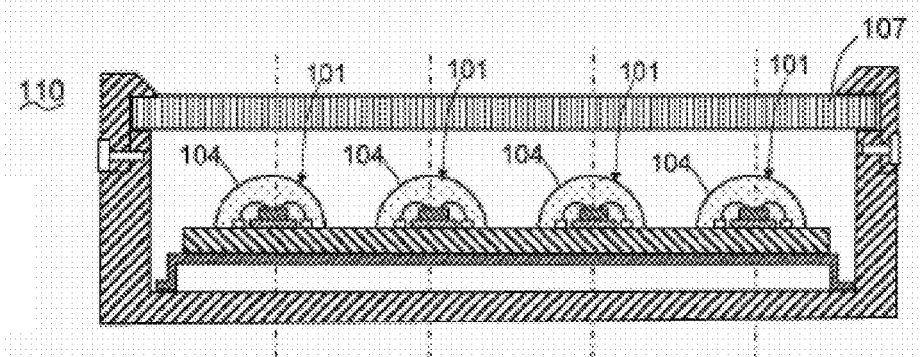
FIGS. 20A and 20B are a side cross sectional view of an illumination apparatus incorporating a plurality of conventional light emitting devices and a view showing a luminance distribution viewed from above the illumination apparatus, respectively.
Figure 20B:
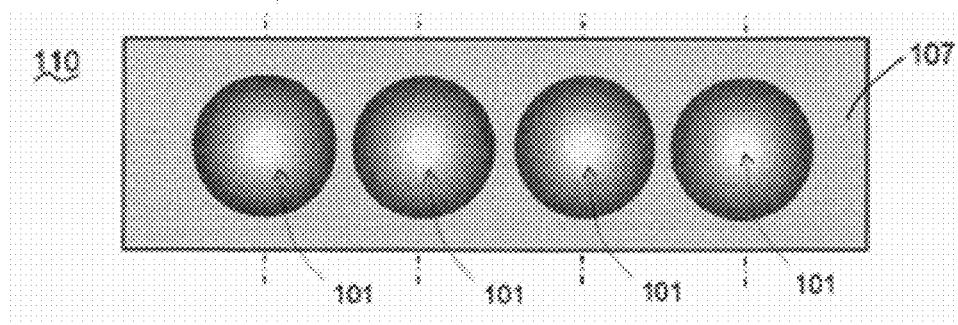

Further, as shown in FIG. 18B, a circular disc-like diffusion cover 71 is provided to cover the ring-like board 3 and the light distribution adjusting members 4. The board 3 is fixed to a disc-like main body 54 by means of screws or the like. In addition, as shown in FIG. 18C, an installation socket 55 is disposed in a central portion of the main body 54 and is connected to circuits formed on the board 3 by means of wirings. Besides, a power supply (not shown) and other necessary devices are mounted on a rear surface of the main body 54 and are electrically connected to the light emitting devices 1 via the installation socket 55.

In accordance with this embodiment, by disposing the LEDs 2 and the light distribution adjusting members 4 in the ring shape, it is possible to realize a emitting illumination apparatus with an annular uniform luminance distribution of the light output surface.

The present invention is not limited to the disclosed embodiments but may be modified in different ways as long as the light emitting device can include a light distribution adjusting member 4 to widen a light distribution perpendicular to an arrangement direction of the LEDs 2 arranged in the form of array. For example, by allowing the shape of the output surface of the wavelength converting member 92 of the sixth embodiment to conform to the shape of the accommodating portion 41 of the light distribution adjusting member 4, it is possible to control lights outputted from the wavelength converting member 92 to be incident on the light distribution adjusting member 4 with high efficiency.

While the invention has been shown and described with respect to the embodiments, it will be understood by those skilled in the art that various changes and modifications may be made without departing from the scope of the invention as defined in the following claims.

What is claimed is:

1. A light emitting device comprising:
   a plurality of solid-state light emitting elements;
   a board on which the solid-state light emitting elements are arranged in the form of an array; and
   a light distribution adjusting member for adjusting a distribution of lights outputted from the solid-state light emitting elements,
   wherein the light distribution adjusting member is provided to commonly cover at least two of the solid-state light emitting elements, and includes a accommodating portion which accommodates the solid-state light emitting elements; a concave curved surface portion provided above light output surfaces of the solid-state light emitting elements and immediately above the solid-state light emitting elements; and a pair of convex curved surface portions which are provided in opposite sides of the concave curved surface portion, each of the convex curved surface portions being smoothly connected to the concave curved surface portion,
   wherein the light output surfaces of the solid-state light emitting elements are covered with a transparent resin member,
   wherein the transparent resin member contains a fluorescent material to form a wavelength converting member, and
   wherein the wavelength converting member is formed to have a thickness larger in a vertical direction the solid-state light emitting elements than that in the lateral direction thereof in a cross section perpendicular to a longitudinal direction of the light distribution adjusting member.

2. The light emitting device of claim 1, further comprising a diffusion and transmission cover member which covers the light distribution adjusting member.

3. The light emitting device of claim 1, wherein a light output surface of the light distribution adjusting member is a rough surface.

4. The light emitting device of claim 1, wherein an air layer is interposed between the solid-state light emitting elements and an inner surface of the accommodating portion.

5. The light emitting device of claim 1, wherein the accommodating portion has slopes in a cross section that is perpendicular to a longitudinal direction thereof in such a way that angles of the slopes become smaller as the slopes approach closer to a light output axis extending through a central portion of each of the light emitting elements.

6. The light emitting device of claim 1, wherein a plurality of convex lenses is provided on a light output surface of the light distribution adjusting member in a longitudinal direction of the light distribution adjusting member.

7. The light emitting device of claim 1, wherein a plurality of concave lenses is provided on a light output surface of the light distribution adjusting member in a longitudinal direction of the light distribution adjusting member.

8. The light emitting device of claim 1, wherein the wavelength converting member is formed to have a vertically long convex shape in the cross section perpendicular to the longitudinal direction of the light distribution adjusting member.

9. The light emitting device of claim 1, wherein the wavelength converting member is formed to have a vertically long triangular shape in the cross section perpendicular to the longitudinal direction of the light distribution adjusting member.

10. The light emitting device of claim 1, wherein the wavelength converting member is formed to have a circular shape when viewed from above.

11. The light emitting device of claim 1, wherein the wavelength converting member is formed to have an ellipsoidal shape in the longitudinal direction of the light distribution adjusting member when viewed from above.

12. The light emitting device of claim 1, wherein the wavelength converting member is formed by coating the transparent resin with a resin containing a fluorescent material or a sheet of a fluorescent material.

13. The light emitting device of claim 1, wherein the solid-state light emitting devices are arranged in a straight line and the light distribution adjusting member is also formed in a straight line.

14. The light emitting device of claim 1, wherein the solid-state light emitting devices are arranged in a ring shape and the light distribution adjusting member is also formed in a ring shape.

15. An illumination apparatus including the light emitting device of claim 1.

* * * * *